United States Patent [19]
Kawami et al.

[11] Patent Number: 5,929,561
[45] Date of Patent: Jul. 27, 1999

[54] ORGANIC ELECTROLUMINESCENCE ELEMENT AND METHOD OF MAKING THEREOF

[75] Inventors: Shin Kawami; Hiroshi Abiko; Takashi Ujihara, all of Yonezawa, Japan

[73] Assignees: Pioneer Electronic Corporation, Tokyo; Tohoku Pioneer Corporation, Yonezawa, both of Japan

[21] Appl. No.: 08/808,167

[22] Filed: Feb. 28, 1997

[30]  Foreign Application Priority Data

Mar. 6, 1996 [JP] Japan .................................. 8-078265

[51] Int. Cl.⁶ .................................................. H05B 33/00
[52] U.S. Cl. .......................... 313/506; 313/504; 313/498; 428/690
[58] Field of Search ....................... 313/506, 504, 313/512, 498; 315/169.3; 428/690, 917

[56]  References Cited

U.S. PATENT DOCUMENTS

| | | | |
|---|---|---|---|
| 4,027,192 | 5/1977 | Hank | 313/498 |
| 4,720,432 | 1/1988 | VanSlyke et al. | 313/506 X |
| 5,674,635 | 10/1997 | Hsieh et al. | 313/504 X |

*Primary Examiner*—Ashok Patel
*Attorney, Agent, or Firm*—Morgan, Lewis & Bockius LLP

[57]  ABSTRACT

An organic electroluminescence element having an anode, an organic layer comprising at least one organic light emitting layer, and a cathode, wherein a face of the anode to which the organic layer is laminated is polished to prevent the generation of a leakage current, and the resultant deterioration of the current-brightness characteristic and destruction of the element.

2 Claims, 3 Drawing Sheets

ORGANIC ELECTROLUMINESCENCE ELEMENT AND METHOD OF MAKING THEREOF

BACKGROUND OF THE INVENTION

1. Field of the Invention

The present invention relates to an organic electroluminescence element which is preferably used in displays, light emitting elements, and the like in various devices of the information industry. In particular, the present invention is directed to an anode structure of an organic electroluminescence element.

2. Description of the Related Art

Prior to the present invention, an electroluminescence element (hereinafter, "organic EL element") was used as an electric field light emitting element in units or pixels in display devices of various industrial instruments. FIG. 4 shows an outline sectional view of essential portions of such a conventional organic EL element. As shown in FIG. 4, an organic EL element 100 comprises four components: a glass substrate 101, an anode 102, an organic layer 103, and a cathode 104. See FIG. 4. The transparent anode 102 is formed on the surface of the transparent glass substrate 101, and the organic layer 103, comprising an organic fluorescent thin film or an organic hole transport layer or the like, is formed on the anode 102. Finally, the cathode 104, constructed from a metal, is formed on the organic layer 103 by vacuum evaporation or the like.

When the organic EL element 100 is designed to emit light, a drive source 105 is connected between the cathode 104 and the anode 102. See FIG. 4. A current flows through the organic layer 103 by a voltage supplied from the connected drive source 105, resulting in the organic layer 103 emitting light. The emitted light is emanated to the outside of the organic EL element via the transparent glass substrate 101.

There are several problems observed with conventional organic EL elements. Generally, a transparent electrode, referred to as an Indium-Tin-Oxide ("ITO"), is used as the anode of the organic EL element. The ITO is formed on the transparent glass substrate by sputtering, electron beam evaporation ("EB"), or the like. However, with the use of such formation methods, the resultant surface of the formed ITO is rough and irregular. The surface roughness of such an ITO as measured by the maximum height ("R max") of the surface roughness as defined in the definition and description (B0601) of the surface roughness prescribed by the Japanese Industrial Standards ("JIS") is in the order of several tens to several hundreds of Angstroms. The maximum height or $R_{max}$ is defined and measured according to JIS No. B0601 in the following manner. A reference length along the surface to be measured is taken along a mean line along the surface of the anode. The mean line is drawn in a direction parallel to the longitudinal axis of the anode. Preferably, the reference length is approximately 20% of the length of the entire surface being evaluated. On the surface of the anode, peaks extend above the mean line and valleys extend below the mean line. First, the highest peak and the lowest valley along the reference length are determined. Second, the distance between the top of the highest peak and the mean line, as measured perpendicularly to the mean line, is determined. Third, the distance from the mean line to the bottom of the lowest valley, as measured perpendicularly to the mean line, is determined. These distances are summed and the total is the maximum height, $R_{max}$. While determining the maximum height, the reference length shall be sampled from the anode face along an area which is free from extraordinary high peaks and deep valleys that may be considered to be flaws.

The roughness of the ITO element results in the generation of leakage current, which results in less light being emitted from the element. Specifically, the thickness of the organic layer 103 laminated on the anode 102 of the organic EL element 100 is very thin—approximately 1000 to 2000 Angstroms. Because the lamination of the organic layer 103 is thin, projections of the rough surface of the ITO create varying distances between the anode and the cathode; i.e., when projections are present on the surface of the ITO, the distance between the anode and the cathode at the projected portions is less than at other portions on the ITO. As a result, when a voltage flowing in a positive direction (which causes the element to emit light) is applied on the surface-rough ITO element, current flows in a concentrated manner on the projected portions of the ITO. This phenomenon is referred to as leakage current. Leakage current is generated when the element is emitting light, the current-brightness characteristic is deteriorated as less than 100% of the current is being utilized to generate light. That is, the anode and the cathode are short-circuited at the projected portions: the current flows only at the projected portions and as a result, the element ceases to emit light.

Moreover, conventional organic EL elements also exhibit inverse bias current, which results in decreased efficiency of the element. Specifically, when leakage current is generated in an organic EL element, the current is apt to flow in an inverse direction at the projected portions. This results in a phenomenon in which an inverse bias current, or a current resulting from application of the voltage in the inverse direction, is increased, producing an unstable current value. The deterioration of the inverse bias voltage caused by the leakage current results in a deterioration of the efficiency of the element.

SUMMARY OF THE INVENTION

The present invention is directed toward a superior organic electroluminescence element which does not exhibit leakage current in driving the element to emit light, and which has a stabilized current value. In addition, the present invention is directed toward a method of making such an electroluminescence element.

An organic electroluminescence element according to the present invention has the following elements: an anode, an organic layer comprising at least one organic light emitting layer, and a cathode.

To prevent the generation of a leakage current, the face of the anode to which the organic layer is laminated is polished. Preferably, the maximum height of surface roughness for the face of the anode to which the organic layer is laminated is 50 Angstroms or less.

A method of making an organic electroluminescence element according to the present invention comprises the following steps: 1) forming an anode on a glass substrate, 2) polishing a surface of the formed anode, 3) forming an organic layer having an organic light emitting layer and comprising at least one layer on the polished anode, and 4) forming a cathode on the formed organic layer. Preferably, in step 2 the surface of the anode is polished such that the maximum height of the surface roughness is 50 Angstroms or less.

The electroluminescence element having a polished anode according to the invention results in suppression of the generation of leakage current and the stable emission of light.

The accompanying drawings, which are included to provide a further understanding of the invention, are incorporated in and constitute a part of this specification. They illustrate several embodiments of the invention and, together with the written description, serve to explain the principles of the invention.

DETAILED DESCRIPTION OF THE PREFERRED EMBODIMENTS

Figure 1A:
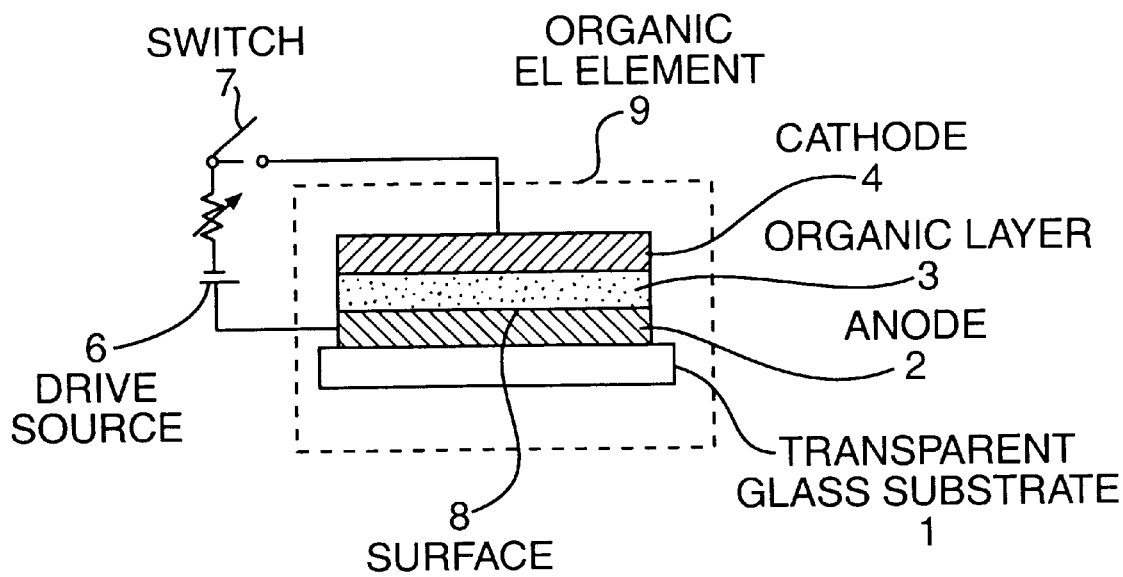
FIGS. 1(a) and 1(b) show outline sectional views of essential portions of an organic EL element according to an embodiment of the present invention.
Figure 1B:
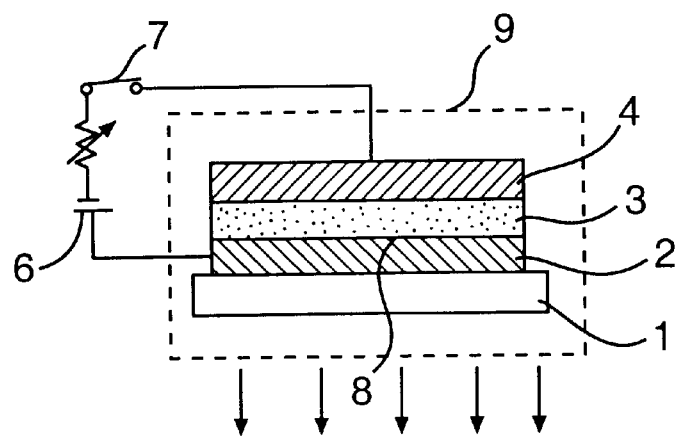

FIGS. 1(a) and 1(b), which depict sectional views of essential portions of an organic EL element, show representational embodiments of the present invention. Fig. 1(a) shows a state of an organic EL element in which a drive voltage for emitting light is not applied, whereas FIG. 1(b) shows a state of an organic EL element in which the drive voltage for emitting light is applied in the forward direction.

An anode 2 to which an organic layer 3 is laminated is formed on the surface of a transparent glass substrate 1. See FIG. 1(a). The anode 2 is constructed of a ITO material or the like, and is evaporated on the glass substrate 1 by sputtering, electron beam ("EB") evaporation, or the like.

A surface 8 of the anode 2 is polished by, for example, polishing, lapping, tape lapping, or the like. "Lapping" consists of moving a quartz, semiconductor, or other crystal slab over a flat plate on which a liquid abrasive has been poured, to obtain a flat polished surface, or to reduce the thickness a carefully controlled amount. See J. Markus and N. Sclater, *McGraw-Hill Electronics Dictionary*, Fifth Edition, page 294 (McGraw-Hill, 1994). "Tape lapping" comprises using tape mixed with grains, such as alumina, SiC, or Cr, to polish the desired surface, and "wet lapping" comprises using one or more liquids mixed with grains, such as alumina, SiC, or Cr, to polish the desired surface. According to one embodiment, the surface of the anode 2 is polished such that the R max of the surface roughness, as defined in the definition and description (B0601) of the surface roughness prescribed by the JIS, is 50 Angstroms or less.

Figure 2A:
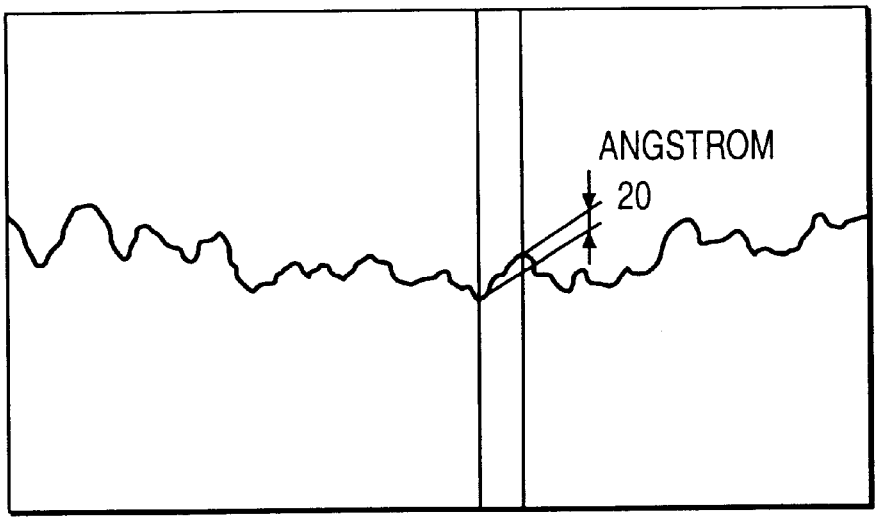
FIG. 2(a) shows a diagram of the horizontal and vertical surfaces of an ITO element of an organic EL element as shown in FIG. 1, wherein the surface of the anode is polished.
Figure 2B:
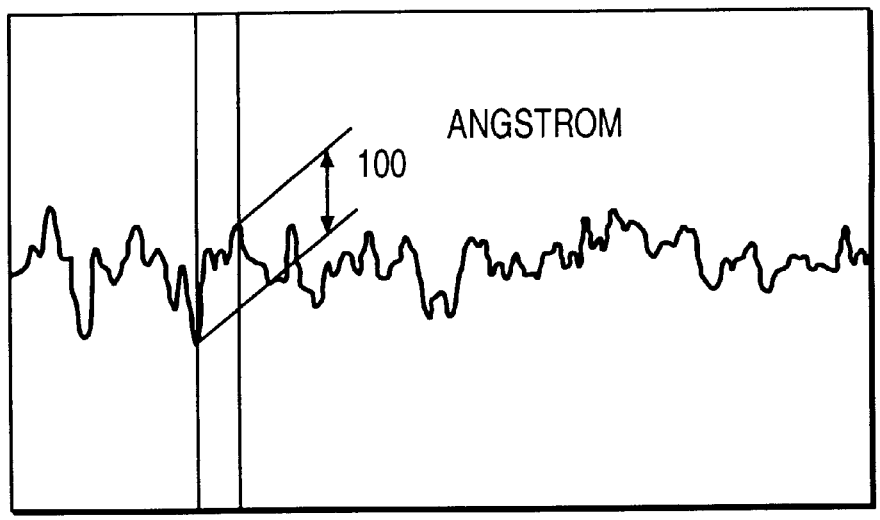
Fig. 2(b) shows a corresponding diagram wherein the surface of the anode is not polished.

FIGS. 2(a) and 2(b) show states of the surface of an anode 2 evaporated on the glass substrate 1 in the organic EL element 9 according to the present invention. Both of FIGS. 2(a) and 2(b) indicate results of surface analysis by an Alternating Force Magnetometer ("AFM"), in which FIG. 2(a) indicates a state after polishing and FIG. 2(b) indicates a state before polishing. For FIG. 2(b), the R max of the surface roughness is about 100 Angstroms in the unpolished state, whereas for FIG. 2(a), the R max of the surface roughness on the polished surface 8 of the anode 2 is 20 Angstroms or less.

An organic layer 3, comprising an organic fluorescent thin film, an organic hole transport layer, or the like, is formed on the polished surface 8 of the anode 2. In addition, a cathode 4 constructed of a metal is formed on the organic layer 3 by vacuum evaporation or the like.

The organic EL element 9 according to the present invention lacks an inter-electrode distance, or a distance between the anode 2 and the cathode 4, which is extremely short. As a result, when the drive voltage for emitting light in the forward direction is applied on the organic EL element 9 by a switch 7, as shown in Fig. 1(b), the organic EL element 9 emits light without generating a leakage current.

Figure 3:
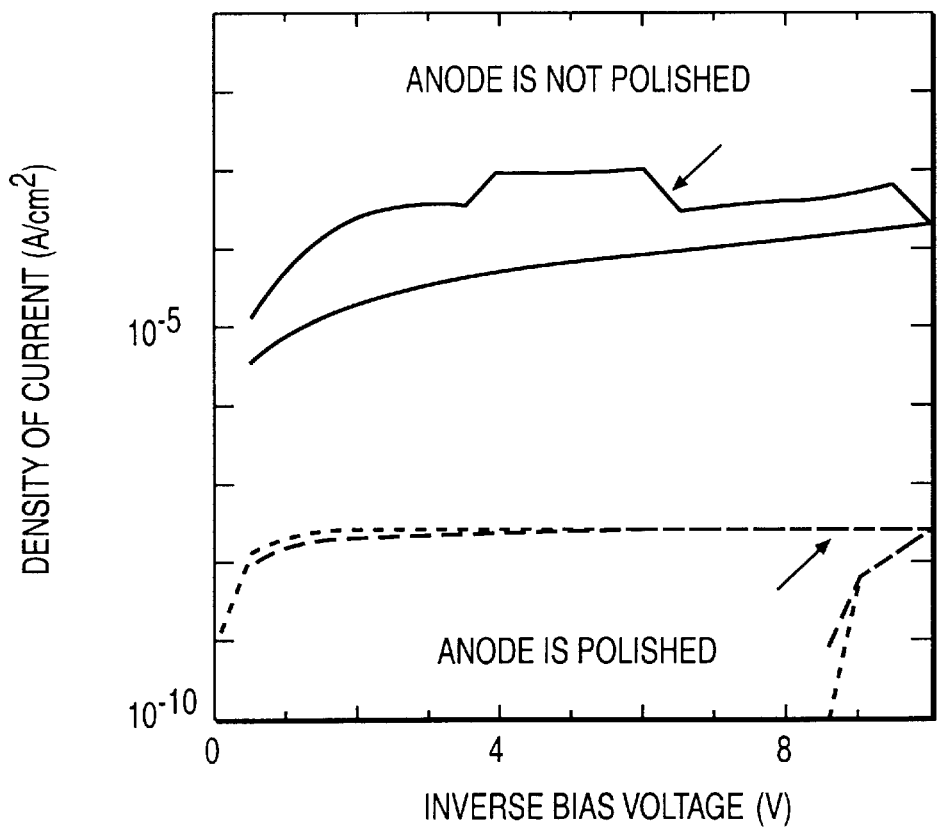
FIG. 3 shows a diagram of the inverse bias voltage as compared to the density of the current of an organic EL element having a polished anode surface according to the present invention (bottom of the figure), and the inverse bias voltage as compared to the density of the current for a conventional organic EL element having an unpolished anode surface (top of the figure)
Figure 4:
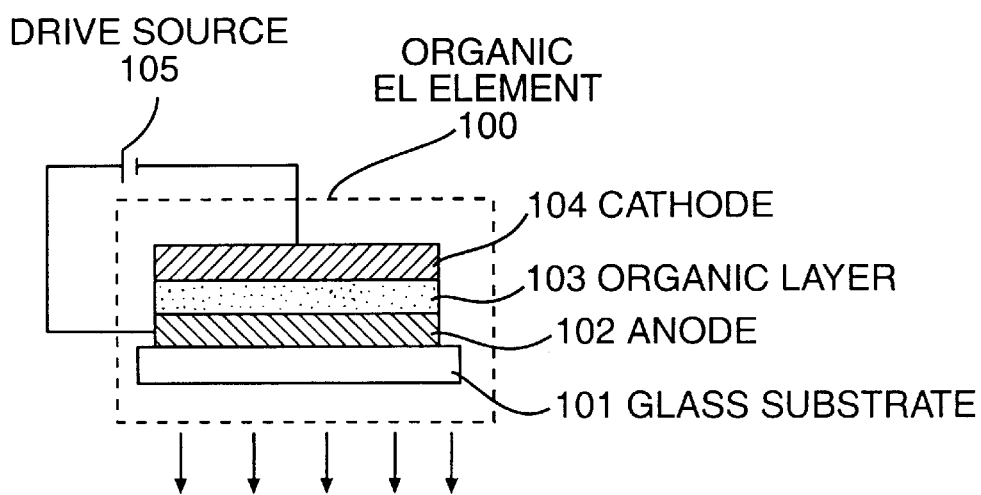
FIG. 4 shows an outline sectional view of the essential portions of a conventional organic EL element.

FIG. 3 shows a graph of the density of current as compared to the inverse bias voltage for an organic EL element having a polished anode surface according to the invention (bottom graph) and for a conventional organic EL element lacking a polished anode surface (top graph). The graphs show the voltage-current characteristics (inverse bias voltage) in which a voltage (inverse bias voltage) is applied on the organic EL element 9 by reversing the polarity of the drive source 6 (as in the case of FIG. 1(b)). In FIG. 3, the horizontal axis represents the inverse bias voltage (V) applied on the element and the vertical axis represents the density ($A/cm^2$) of current (inverse bias current) flowing in the element. The solid lines of FIG. 3 represent the result of applying an inverse bias voltage in the range of 0 through 10 V on a conventional organic EL element 100 having an unpolished anode. The dotted lines of FIG. 3 represent the result of similarly applying an inverse bias voltage in the range of 0 through 10 V on an organic EL element 9 having a polished anode, as described by the present invention.

For an organic EL element, the current density of the inverse bias current is generally stabilized to about $1 \times 10^{-7}$ ($A/cm^2$) for an organic EL element. However, as shown by FIG. 3, with a conventional organic EL element the current density has a very large value which varies considerably with the applied inverse bias voltage value. This indicates generation of leakage current for a conventional EL element 100.

In contrast, also as shown by FIG. 3, the organic EL element 9 according to the invention exhibits an extremely low current density and, in addition, the current value is stabilized as it is not influenced by a variation in the applied inverse bias voltage. This indicates that leakage current is not generated for the organic EL element according to the invention.

It is noted that while it is preferable that the roughness of the surface 8 of the anode 2 is such that the R max of the surface roughness as defined by the definition and description (B0601) of the surface roughness prescribed by the JIS is 20 Angstroms or less, similar results can be obtained for organic EL elements having an anode surface with a R max of 50 Angstroms or less.

As described above, the organic EL element according to the present invention is superior as compared to conventional organic EL elements as it does not result in the generation of a leakage current. The generation of a leakage current is undesirable as it causes a deterioration of the current-brightness characteristic in driving the element, resulting in a destruction of the element by short-circuiting. In contrast, the organic EL element having a polished anode according to the present invention prevents the deterioration of the inverse bias voltage and, therefore, results in an organic EL element which is more efficient than conventional EL elements.

It will be apparent to those skilled in the art that various modifications and variations can be made in the methods of the present invention without departing from the spirit or scope of the invention. Thus, it is intended that the present invention cover the modifications and variations of this invention provided they come within the scope of the appended claims and their equivalents.

What is claimed is:

1. An organic electroluminescence element comprising:
   (1) an anode;
   (2) an organic layer comprising at least one organic light-emitting layer; and
   (3) a cathode,
   wherein a face of the anode to which the organic layer is laminated includes peaks and valleys of differing heights and depths, the anode face is polished such that a maximum height of a surface roughness of the anode face as measured along a vertical distance between a highest peak to a lowest valley along a portion of the anode face is of about 50 Angstroms or less.

2. The organic electroluminescence element according to claim 1, wherein the maximum height of the surface roughness of the face of the polished anode is about 20 Angstroms or less.

* * * * *